US008513131B2

(12) United States Patent
Cai et al.

(10) Patent No.: US 8,513,131 B2
(45) Date of Patent: Aug. 20, 2013

(54) FIN FIELD EFFECT TRANSISTOR WITH VARIABLE CHANNEL THICKNESS FOR THRESHOLD VOLTAGE TUNING

(75) Inventors: Ming Cai, Hopewell Junction, NY (US); Dechao Guo, Fishkill, NY (US); Chung-hsun Lin, White Plains, NY (US); Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 13/050,101

(22) Filed: Mar. 17, 2011

(65) Prior Publication Data
US 2012/0235247 A1 Sep. 20, 2012

(51) Int. Cl.
*H01L 21/311* (2006.01)

(52) U.S. Cl.
USPC ........... 438/696; 438/697; 438/699; 438/738; 438/942; 246/12; 246/47; 257/435; 257/E21.018; 257/E21.249

(58) Field of Classification Search
USPC ................ 438/669, 671, 689, 694, 695, 696, 438/697, 699, 736, 787, 942; 216/12, 41, 216/42, 47, 46; 257/435, E21.017, E21.018, 257/E21.24, E21.249
See application file for complete search history.

(56) References Cited

U.S. PATENT DOCUMENTS

| 6,413,802 | B1 | 7/2002 | Hu et al. |
|---|---|---|---|
| 6,492,212 | B1 | 12/2002 | Ieong et al. |
| 6,872,647 | B1 | 3/2005 | Yu et al. |
| 6,894,326 | B2 | 5/2005 | Nowak |
| 7,087,471 | B2 | 8/2006 | Beintner |
| 7,300,837 | B2 | 11/2007 | Chen et al. |
| 7,416,927 | B2 | 8/2008 | Gottsche et al. |
| 7,763,531 | B2 | 7/2010 | Abadeer et al. |
| 8,178,442 | B2 * | 5/2012 | Park et al. ............ 438/696 |
| 2007/0249174 | A1 * | 10/2007 | Yang ..................... 438/712 |
| 2008/0050898 | A1 * | 2/2008 | Luan ..................... 438/585 |

OTHER PUBLICATIONS

Dauge, et al., "Coupling Effects and Channels Seperation in FinFETs", Solid-State Electronics, vol. 48, 2004, pp. 535-542.
Kawasaki, et al., "Challenges and Solutions of FinFET Integration in an SRAM Cell and a Logic Circuit for 22 NM Node and Beyond", 2009 IEEE International Electron Devices Meeting (IEDM), Dec. 7-9, 2009, pp. 1-4.
Liu, et al., "4-Terminal FinFETs with High Treshold Voltage Controllability", Conference Digest Device Research Conference, 2004. vol. 1, pp. 207-208.

* cited by examiner

*Primary Examiner* — William D Coleman
*Assistant Examiner* — Su Kim
(74) *Attorney, Agent, or Firm* — Cantor Colburn LLP; Vazken Alexanian

(57) ABSTRACT

A method of forming an integrated circuit (IC) includes forming a first and second plurality of spacers on a substrate, wherein the substrate includes a silicon layer, and wherein the first plurality of spacers have a thickness that is different from a thickness of the second plurality of spacers; and etching the silicon layer in the substrate using the first and second plurality of spacers as a mask, wherein the etched silicon layer forms a first plurality and a second plurality of fin field effect transistor (FINFET) channel regions, and wherein the first plurality of FINFET channel regions each have a respective thickness that corresponds to the thickness of the first plurality of spacers, and wherein the second plurality of FINFET channel regions each have a respective thickness that corresponds to the thickness of the second plurality of spacers.

14 Claims, 10 Drawing Sheets

FIN FIELD EFFECT TRANSISTOR WITH VARIABLE CHANNEL THICKNESS FOR THRESHOLD VOLTAGE TUNING

BACKGROUND

This disclosure relates generally to the field of semiconductor fabrication, and more particularly to threshold voltage tuning for fin field effect transistors (FINFET) on a substrate through variation of the FINFET channel thicknesses.

Integrated circuits (ICs) may include large numbers of devices on a single substrate. As the number of devices formed per IC substrate and the density of the devices on the substrate increases, the dimensions of the individual devices drops significantly. In particular, the dimensions of gate thickness and channel separation of source and drain elements of field effect transistor (FET) devices may be reduced such that micrometer and nanometer separations of the source, drain, and gate in the substrate are required. Although devices are being steadily reduced in size, the performance characteristics of the devices must be maintained or improved. In addition to performance characteristics, performance reliability, and durability of devices, manufacturing reliability and cost are also critical.

Several problems may arise with the miniaturization of devices, including short channel effects, punch-through, and current leakage. These problems affect both the performance of the devices and the manufacturing process. The impact of short channel effects on device performance is seen in a reduction in the device threshold voltage and an increase of sub-threshold current. More particularly, as the channel length becomes smaller, the source and drain depletion regions get closer to each other. The depletion regions may essentially occupy the entire channel area between the source and drain. As a result of this effective occupation of the channel area by the source and drain depletion regions, the channel is in part depleted and the gate charge necessary to alter the source and drain current flow is reduced.

A FINFET is a type of FET structure that exhibits reduced short channel effects. In a FINFET structure, the channel is formed as a vertical silicon fin structure on top of a substrate, with the gate also being located in the fin structure on top of the channel. A FINFET may be formed on an undoped or low-doped substrate. FINFETs may have superior carrier mobility, due to lowered effective field ($E_{eff}$) and reduced carrier scattering. A FINFET structure may also alleviate random dopant fluctuation (RDF) at relatively small devices dimensions as compared to a standard FET.

Depending on the application for which an IC chip is used, FINFETs having different threshold voltages ($V_t$) may need to be present in the IC. However, variation of the threshold voltages across a large number of FINFETs on a single substrate may present difficulties. The threshold voltage may be modulated by tuning the FINFET gate stack workfunctions (WF), but gate stack patterning to tune the WF in gate-first FINFET fabrication is challenging, and the choice of gate metals that results in different WFs that may be used in gate-last processing is relatively limited.

BRIEF SUMMARY

In one aspect, a method of forming an integrated circuit (IC) includes forming a first and second plurality of spacers on a substrate, wherein the substrate includes a silicon layer, and wherein the first plurality of spacers have a thickness that is different from a thickness of the second plurality of spacers; and etching the silicon layer in the substrate using the first and second plurality of spacers as a mask, wherein the etched silicon layer forms a first plurality and a second plurality of FINFET channel regions, and wherein the first plurality of FINFET channel regions each have a respective thickness that corresponds to the thickness of the first plurality of spacers, and wherein the second plurality of FINFET channel regions each have a respective thickness that corresponds to the thickness of the second plurality of spacers.

In another aspect, an integrated circuit (IC) includes a first plurality of fin field effect transistors (FINFETs) and a second plurality of FINFETs located on a substrate, the first plurality of FINFETs having a first channel thickness corresponding to a first threshold voltage, and the second plurality of FINFETs having a second channel thickness corresponding to a second threshold voltage, wherein the first channel thickness is different from the second channel thickness, and the first threshold voltage is different from the second threshold voltage.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of an IC that includes FINFETs having variable channel thicknesses for threshold voltage tuning, and methods of forming an IC that includes FINFETs having variable channel thicknesses for threshold voltage tuning, are provided, with exemplary embodiments being discussed below in detail. The threshold voltage of a FINFET device may be tuned by varying the thickness of the silicon that makes up the FINFET channel, which is in turn dependent on the thickness of the FINFET fin. Therefore, a plurality of FINFETs on a substrate may be formed with fin thicknesses, giving a range of device threshold voltages in a single IC. The threshold voltages of the different FINFET devices on the single substrate may be tuned across a range of about 100 millivolts (mV) or more in some embodiments, allowing for a wide variety of different IC design purposes.

To form FINFETs having a range of fin thicknesses, spacers having varied thicknesses corresponding to the desired range of fin thicknesses and threshold voltages are formed on the substrate, and the spacers are then used as masks to etch the FINFET fins into the substrate. The spacers may be formed on an undoped or low-doped substrate, which may include a silicon-on-insulator (SOI) substrate. The spacers may be formed using sidewall image transfer (SIT) spacer formation, which includes spacer material deposition followed by directional reactive ion etching (RIE) of the deposited spacer material. The threshold voltage of a FINFET may be modulated from about 150 mV to about 300 mV as the silicon thickness ($T_{Si}$) in the FINFET channel scales down from about 12 nm to about 5 nm in some embodiments. FINFET threshold voltage also increases as the $T_{Si}$ is scaled down below 5 nanometers (nm), due to exhaustion of depletion charge and geometrical confinement.

Figure 1:
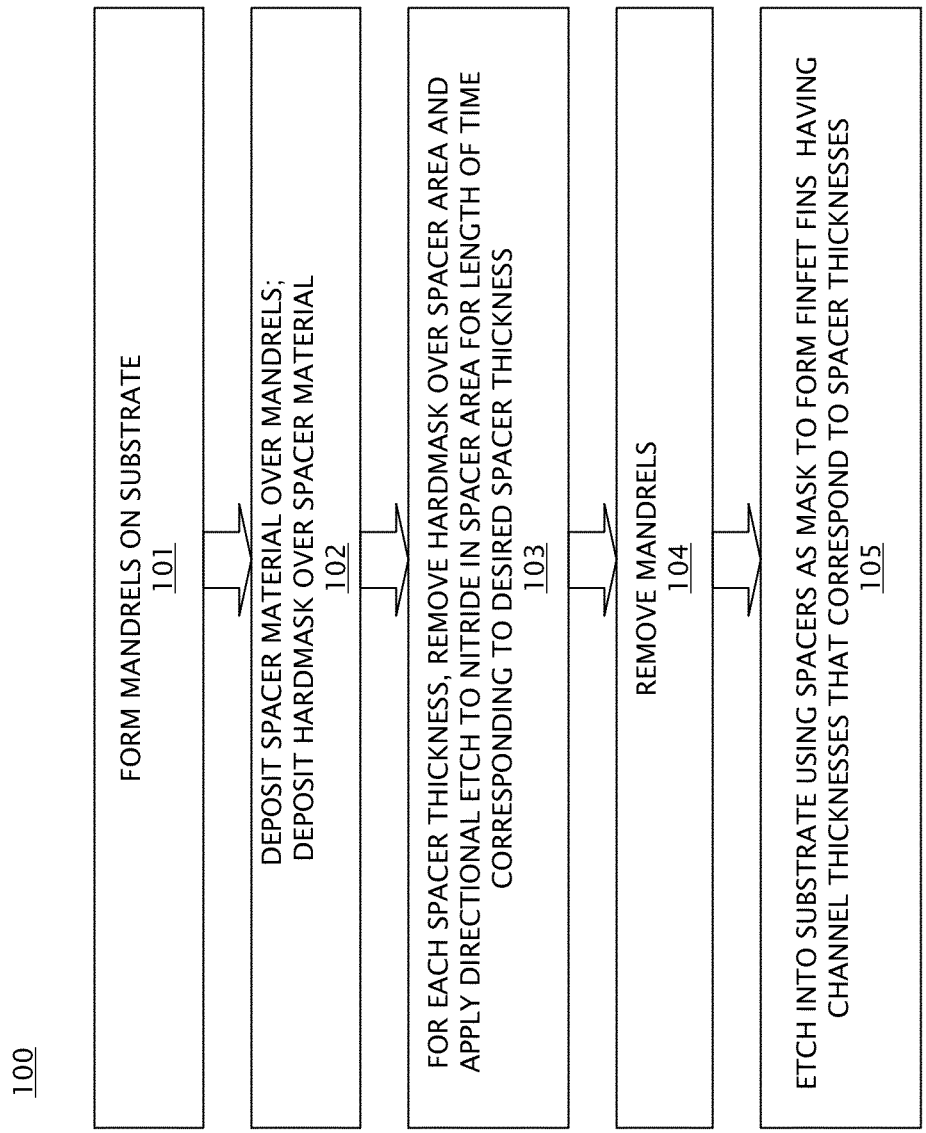
FIG. 1 is a flowchart illustrating an embodiment of a method for threshold voltage tuning for FINFETs through variation of channel thickness.
Figure 2:
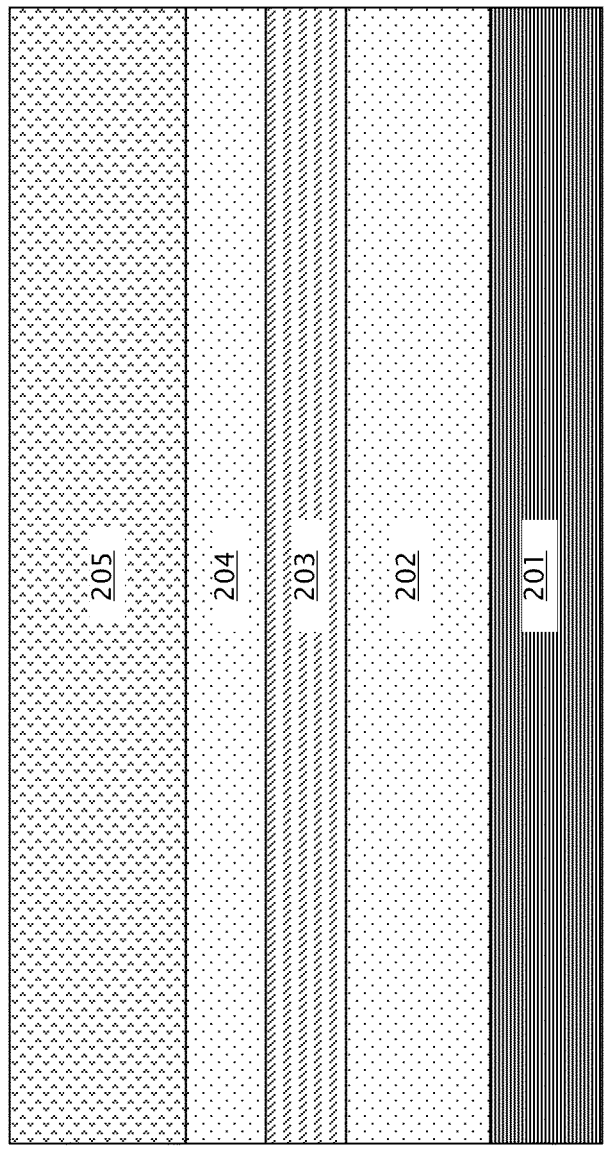
FIG. 2 is a schematic block diagram illustrating a cross section of an embodiment of a starting substrate for threshold voltage tuning for FINFETs through variation of channel thickness.
Figure 3:
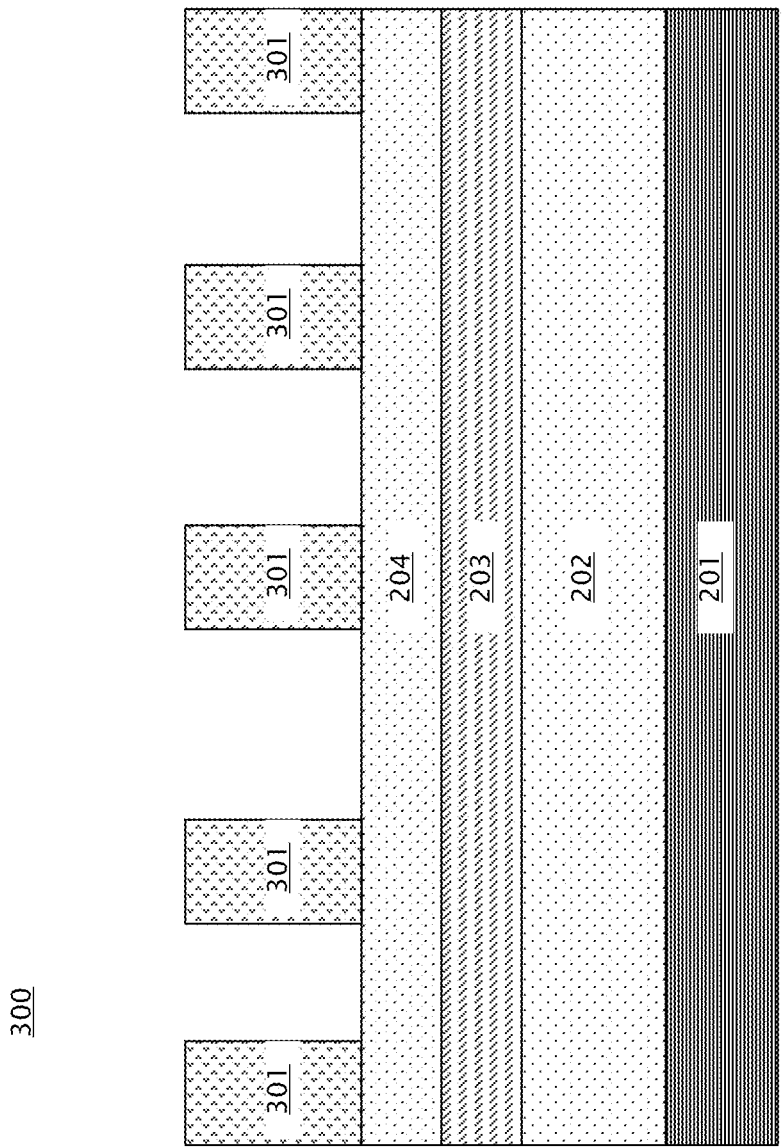
FIG. 3 is a schematic block diagram illustrating a cross section of the device of FIG. 2 after patterning a top layer to form mandrels.
Figure 4:
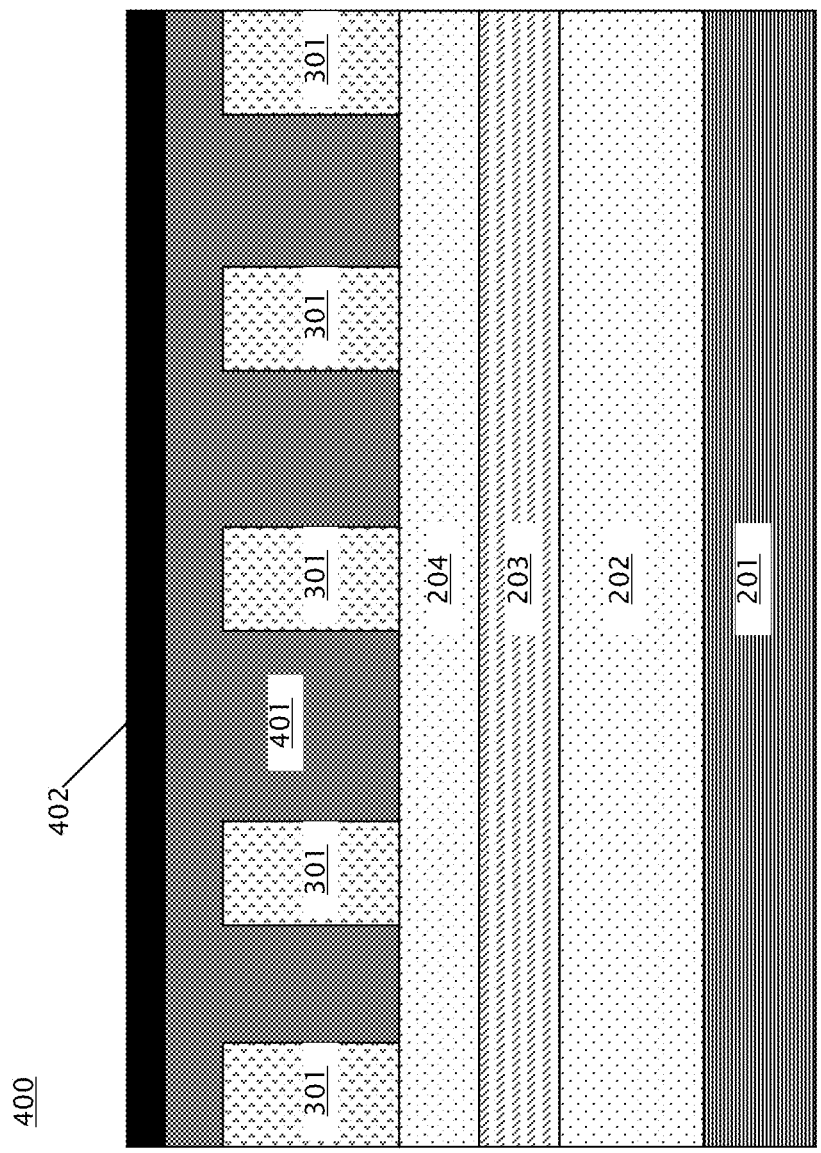
FIG. 4 is a schematic block diagram illustrating a cross section of the device of FIG. 3 after depositing spacer material and a hardmask over the mandrels.

FIG. 1 illustrates an embodiment of a method 100 for threshold voltage tuning for FINFETs through variation of channel thickness. FIG. 1 is discussed with respect to FIGS. 2-10. Method 100 is performed using a substrate such as substrate 200 that includes a silicon layer, such as SOI 203, as is shown in FIG. 2. In addition to SOI 203, substrate 200 includes bottom substrate 201, buried oxide (BOX) 202, oxide 204, and mandrel material 205. In block 101, mandrel material 205 is patterned to form mandrels 301, as shown in FIG. 3. The mandrels 301 provide a corrugated topology on which the spacers are formed using SIT spacer formation. Mandrel material 205 and mandrels 301 may include polysilicon or amorphous silicon in some embodiments, and may be plasma-enhanced chemical vapor deposition (PECVD) polysilicon or amorphous silicon. In block 102, spacer material 401 is deposited over and around the mandrels 301, and a hardmask 402 is formed over the spacer material 401, as shown in FIG. 4. Spacer material 401 may include nitride. Hardmask 402 may include oxide, which may be either high density plasma (HDP) oxide or high-aspect-ratio process (HARP) oxide in various embodiments.

Figure 5:
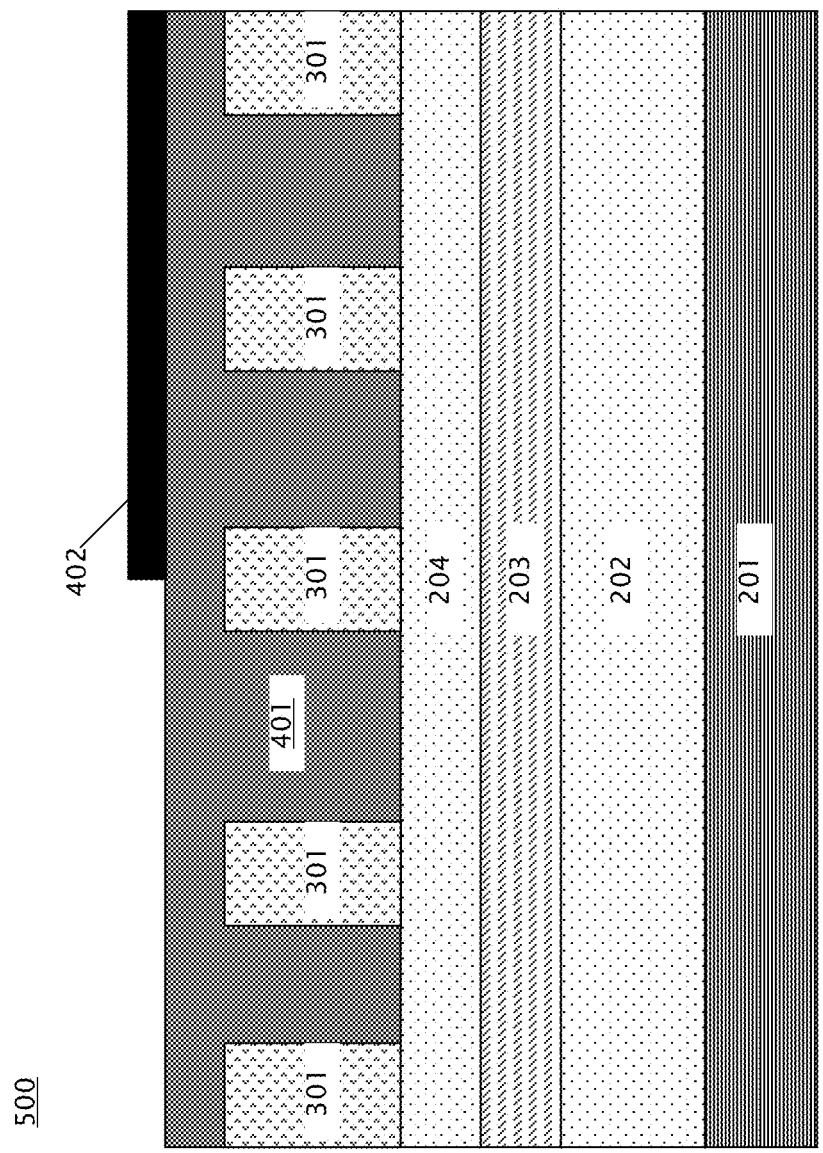
FIG. 5 is a schematic block diagram illustrating a cross section of the device of FIG. 4 after removal of the hardmask from a first area of the spacer material.
Figure 6:
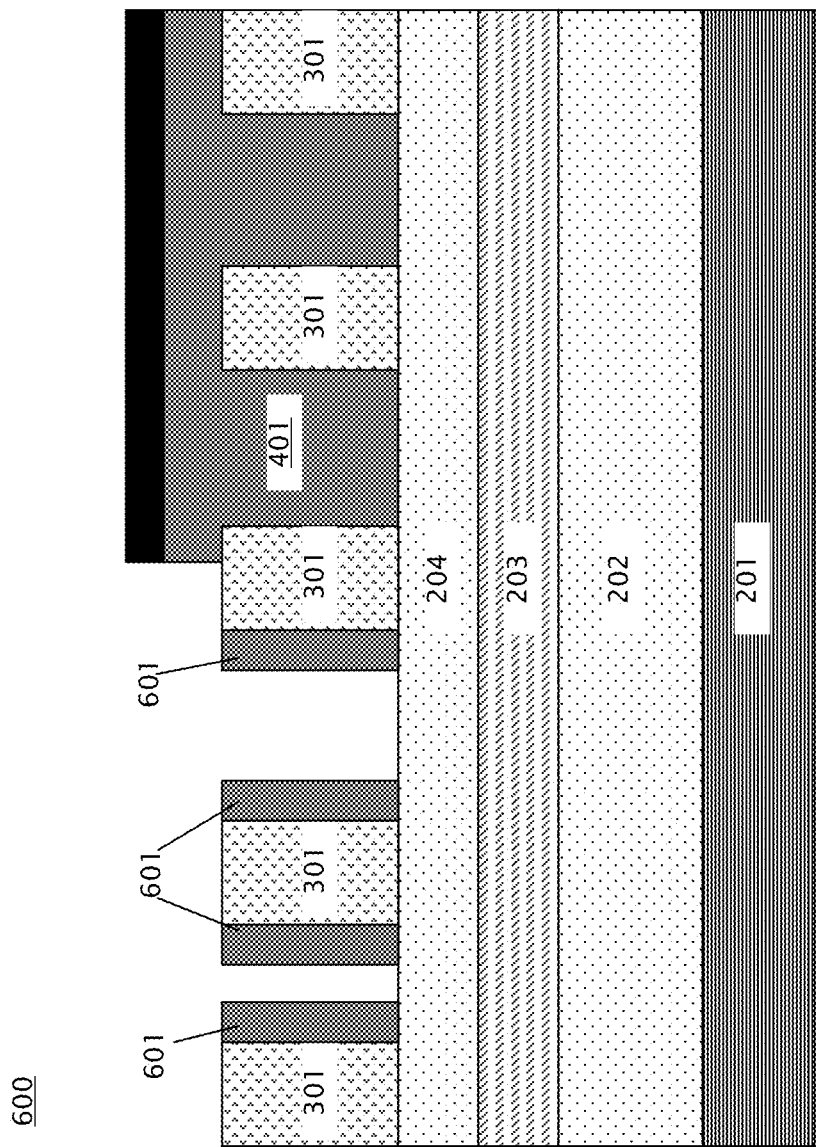
FIG. 6 is a schematic block diagram illustrating a cross section of the device of FIG. 5 after sidewall image transfer etch in the first area where the hardmask was removed.
Figure 7:
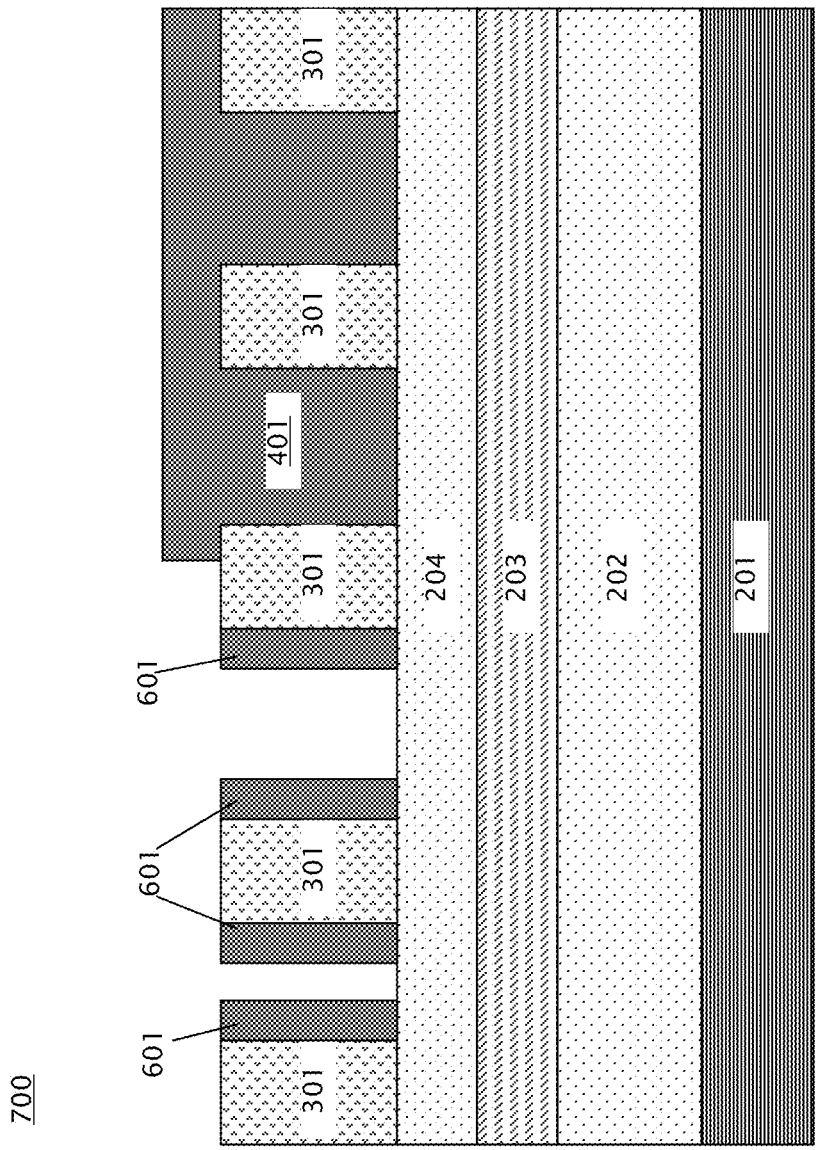
FIG. 7 is a schematic block diagram illustrating a cross section of the device of FIG. 6 after removal of the hardmask from a second area of the spacer material.
Figure 8:
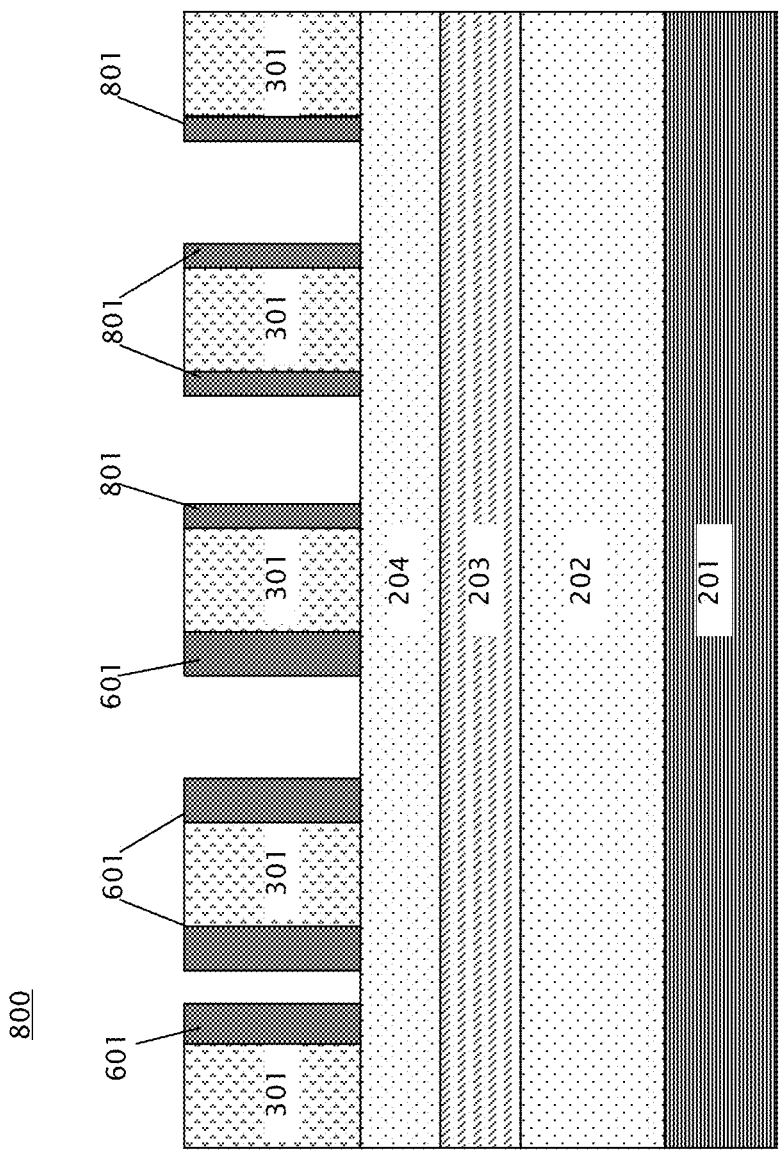
FIG. 8 is a schematic block diagram illustrating a cross section of the device of FIG. 7 after sidewall image transfer etch in the second area where the hardmask was removed.

In block 103, the hardmask 402 is lithographically patterned to open up a first region of spacer material 401 corresponding to a first desired spacer thickness, as shown in FIG. 5, and then, as shown in FIG. 6, the spacer material 401 in the area from which hardmask 402 was removed in FIG. 5 is etched using a SIT spacer etch to form spacers 601 having a first thickness. Block 103 is repeated as needed for each desired spacer thickness, with previously formed spacers (such as spacers 601) being covered by a protective hardmask or photoresist (not shown) during subsequent spacer formation. To form a second set of spacers having a second thickness, another portion of hardmask 402 is removed from spacer material 401 as shown in FIG. 7, and SIT spacer etch of the spacer material 401 located under the removed hardmask is used to form the second set of spacers 801 having the second thickness, as shown in FIG. 8. A longer SIT etch time may be used to produce thinner spacers, and a shorter SIT etch time may be used to produce thicker spacers. The SIT spacer etch is a directional reactive ion etch (RIE). The SIT spacer etch removes material from horizontal surfaces faster than it removes material from vertical surfaces, allowing for relative precision in spacer thickness formation. Spacers 601 and 801 are shown for illustrative purposes only; any appropriate number and thickness of spacers may be formed by repeating the steps of block 103, including removal of the hardmask 402 from a portion of spacer material 401 and etching the spacer material 401 located under the removed hardmask, any desired number of times. Any previously formed spacers are covered with a protective hardmask or photoresist (not shown) during subsequent spacer etching; the protective hardmask or photoresist is then removed after all the spacers on the substrate have been etched. The etched spacers may vary in thickness from about 1 nm to about 12 nm in some embodiments.

Figure 9:
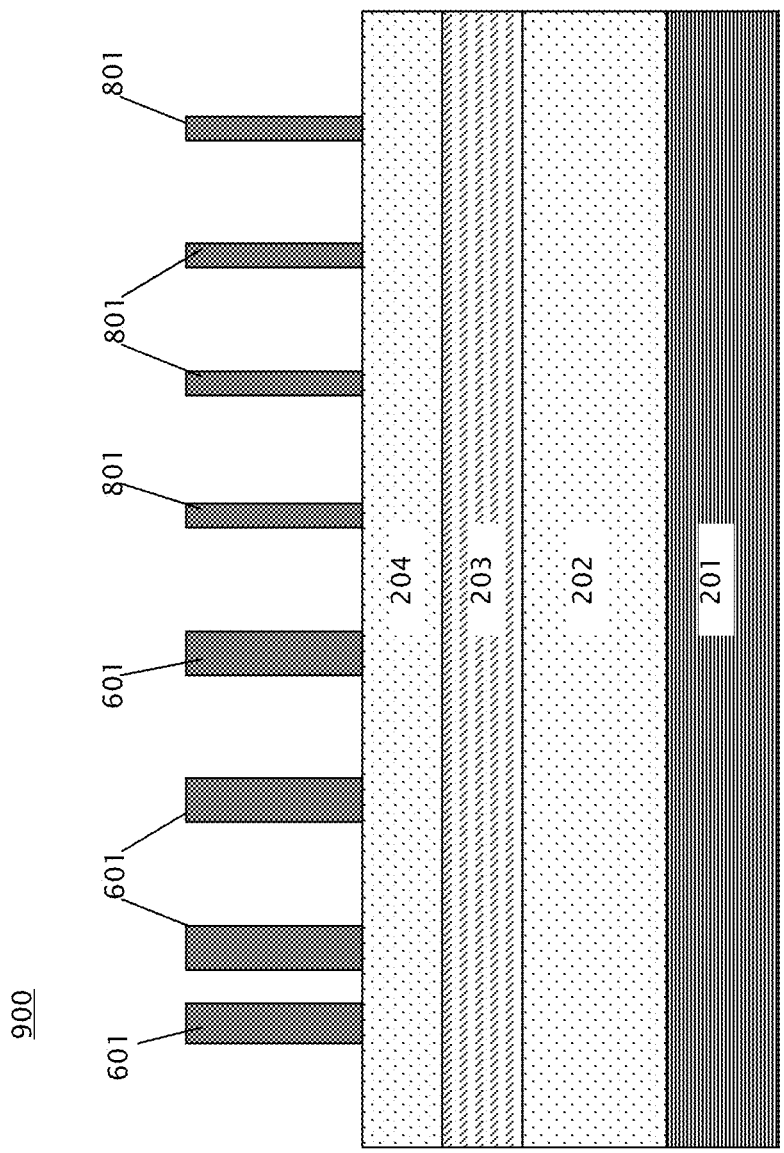
FIG. 9 is a schematic block diagram illustrating a cross section of the device of FIG. 8 after removal of the mandrels.

In block 104, the mandrels 301 are removed, as shown in FIG. 9, leaving spacers 601 and 801 on the substrate that includes bottom substrate 201, BOX 202, SOI 203, and oxide 204. Mandrels 301 may be removed by a mandrel pull, which may include etching the polysilicon or amorphous silicon that comprises mandrels 301.

Figure 10:
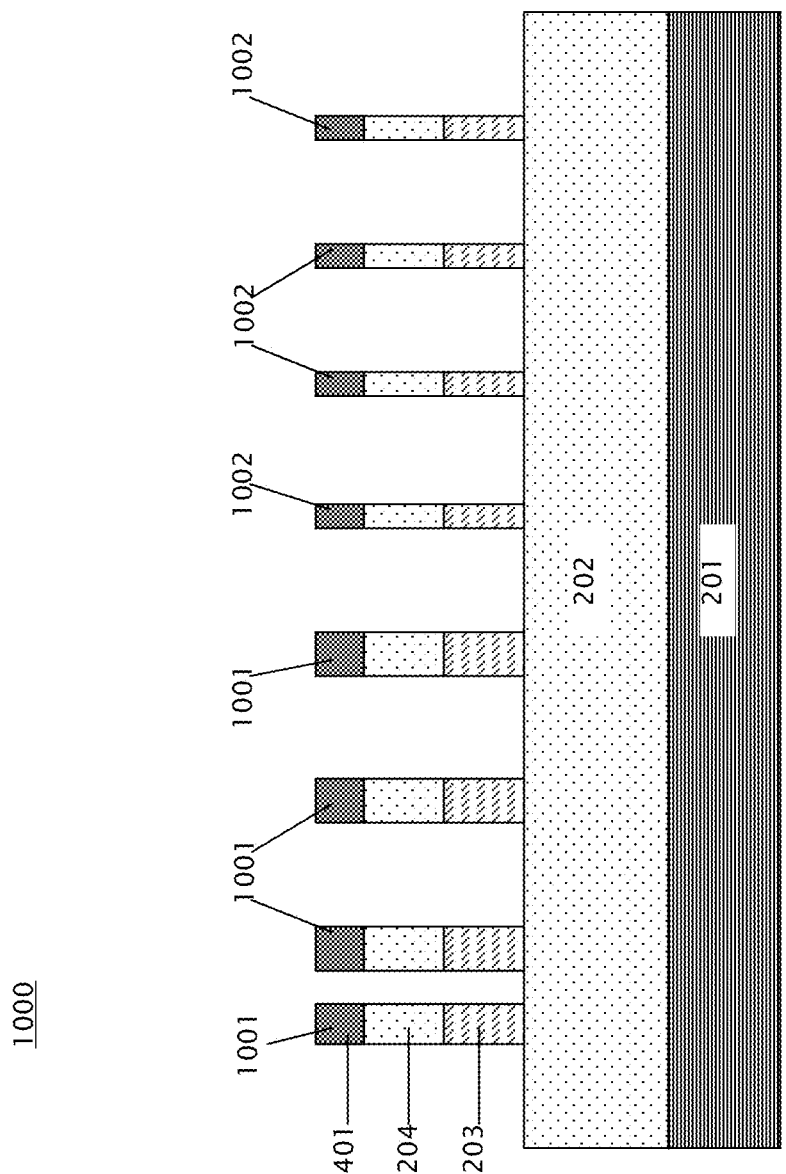
FIG. 10 is a schematic block diagram illustrating a cross section of the device of FIG. 9 after etching into the substrate to form FINFET fins having variable channel thicknesses for threshold voltage tuning.

In block 105, the oxide 204 and SOI 203 in the substrate are etched to form a an IC 1000 that includes a plurality of FINFET fins, such as FINFET fins 1001 and 1002, that have thicknesses corresponding to the thicknesses of spacers 601 and 801, as shown in FIG. 10. Spacers 601 and 801 act as a mask during the fin etch of block 105. Each of the etched FINFET fins includes etched silicon 203, which acts as the FINFET channel, etched oxide 204, and etched spacer material 401. The etch of block 105 may include RIE in some embodiments. The plurality of FINFET fins such as FINFET fins 1001 and 1002 in IC 1000 may have a range of channel thicknesses from about 1 nm to about 12 nm, which may correspond to a range of threshold voltages of about 100 mV or more in some embodiments. The threshold voltages may range from about 150 mV to about 300 mV in some embodiments.

The substrate 200 (including bottom substrate 201, BOX 202, SOI 203, oxide 204, and mandrel material 205), spacers 601 and 801, and FINFET fins 1001 and 1002 are shown for illustrative purposes only. Method 100 may be applied to any appropriate substrate on which FINFETs may be formed, and may be used to form any appropriate number of FINFET fins having any desired number and range of different channel thicknesses and corresponding different threshold voltages.

The technical effects and benefits of exemplary embodiments include formation of an IC that includes FINFETs having a range of threshold voltages on a single substrate.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of forming an integrated circuit (IC), the method comprising:
    forming a first and second plurality of spacers on a substrate, wherein the substrate includes a silicon layer, and wherein the first plurality of spacers have a thickness that is different from a thickness of the second plurality of spacers, wherein forming the first and second plurality of spacers on a substrate comprises:
    forming a plurality of mandrels on the substrate;
    depositing a spacer material over the mandrels;
    depositing a hardmask over the spacer material;
    removing a first portion of the hardmask from a first area of the spacer material corresponding to the first plurality of spacers;
    etching the spacer material from which the first portion of the hardmask is removed for a first etch time to form the first plurality of spacers;
    removing a second portion of the hardmask from a second area of the spacer material corresponding to the second plurality of spacers;
    etching the spacer material from which the second portion of the hardmask a removed for a second etch time to form the second plurality of spacers; and
    etching the silicon layer in the substrate using the first and second plurality of spacers as a mask, wherein the etched silicon layer forms a first plurality and a second plurality of fin field effect transistor (FINFET) channel regions, and wherein the first plurality of FINFET channel regions each have a respective thickness that corresponds to the thickness of the first plurality of spacers, and wherein the second plurality of FINFET channel regions each have a respective thickness that corresponds to the thickness of the second plurality of spacers.

2. The method of claim 1, wherein the thickness of the first plurality FINFET channel regions corresponds to a first threshold voltage that is different from a second threshold voltage corresponding to the thickness of the second plurality of FINFET channel regions.

3. The method of claim 2, wherein the first threshold voltage and the second threshold voltage range from about 150 millivolts to about 300 millivolts.

4. The method of claim 1, wherein the thickness of the first plurality of spacers and the thickness of the second plurality of spacers range from about 1 nanometer to about 12 nanometers.

5. The method of claim 1, wherein the mandrels are formed by etching a top layer of the substrate.

6. The method of claim 1, wherein the mandrels comprise one of polysilicon and amorphous silicon.

7. The method of claim 1, wherein the spacer material comprises nitride.

8. The method of claim 1, wherein the hardmask comprises one of high density plasma (HDP) oxide or high-aspect-ratio process (HARP) oxide.

9. The method of claim 1, wherein etching the spacer material comprises a directional reactive ion etch.

10. The method of claim 1, wherein the first etch time is different from the second etch time, and wherein the first etch time determines the thickness of the first plurality of spacers, and wherein the second etch time determines the thickness of the second plurality of spacers.

11. The method of claim 1, further comprising covering the first plurality of spacers with a protective layer during the etch of the second plurality of spacers, and removing the protective layer after the etch of the second plurality of spacers.

12. The method of claim 11, wherein the protective layer comprises one of an oxide and photoresist.

13. The method of claim 1, further comprising:
    removing a third portion of the hardmask from a third area of the spacer material corresponding to a third plurality of spacers having a third thickness;
    etching the spacer material from which the third portion of the hardmask was removed for a third etch time to form the third plurality of spacers.

14. The method of claim 1, wherein the substrate further comprises an oxide layer located over the silicon layer, and wherein the oxide layer is etched during the etching of the silicon layer.

* * * * *